United States Patent
Kim et al.

(10) Patent No.: US 6,686,788 B2
(45) Date of Patent: Feb. 3, 2004

(54) DELAY CIRCUIT OF CLOCK SYNCHRONIZATION DEVICE USING DELAY CELLS HAVING WIDE DELAY RANGE

(75) Inventors: Se Jun Kim, Kyoungki-do (KR); Sang Hoon Hong, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/140,280

(22) Filed: May 6, 2002

(65) Prior Publication Data

US 2003/0006818 A1 Jan. 9, 2003

(30) Foreign Application Priority Data

Jun. 30, 2001 (KR) .......................................... 2001-39015

(51) Int. Cl.[7] .............................................. H03H 11/26
(52) U.S. Cl. ....................................... 327/280; 327/285
(58) Field of Search ................................ 327/280, 281, 327/285, 287, 288, 564, 153, 155, 161, 261, 264, 266, 270, 274, 228

(56) References Cited

U.S. PATENT DOCUMENTS

| | | | | |
|---|---|---|---|---|
| 5,179,303 A | * | 1/1993 | Searles et al. | 327/277 |
| 5,426,398 A | * | 6/1995 | Kuo | 331/57 |
| 5,559,476 A | * | 9/1996 | Zhang et al. | 331/57 |
| 5,576,647 A | * | 11/1996 | Sutardja et al. | 327/108 |
| 5,600,280 A | | 2/1997 | Zhang | 331/57 |
| 5,748,048 A | * | 5/1998 | Moyal | 331/34 |
| 5,955,929 A | * | 9/1999 | Moon et al. | 331/57 |
| 5,963,101 A | * | 10/1999 | Iravani | 331/57 |
| 5,994,939 A | * | 11/1999 | Johnson et al. | 327/280 |
| 6,043,719 A | * | 3/2000 | Lin et al. | 331/57 |
| 6,104,254 A | * | 8/2000 | Iravani | 331/57 |
| 6,255,881 B1 | * | 7/2001 | Balistreri et al. | 327/280 |
| 6,353,368 B1 | * | 3/2002 | Iravani | 331/57 |
| 6,469,585 B1 | * | 10/2002 | Dai et al. | 331/57 |

OTHER PUBLICATIONS

*Notice Of Rejection* (with translation), corresponding to Korean Patent Application Ser. No. 10–2001–0039015, Korean Intellectual Property Office, dated Jan. 23, 2003, 4 pages.

* cited by examiner

*Primary Examiner*—My-Trang Nu Ton
(74) *Attorney, Agent, or Firm*—Marshall, Gerstein & Borun LLP

(57) ABSTRACT

A delay circuit of a clock synchronization device that includes an operational amplifier for setting the level of a current control voltage according to a voltage difference between a regulation voltage and a reference voltage. A number of unit delay cells connected in series are included, each having a delay time set according to a resistance control voltage and the current control voltage. Also, a variable resistance unit is included having a resistance value adjusted according to the resistance control voltage, where the variable resistance unit includes a cross coupled adjustment device that outputs signals to a next unit delay cell. The delay cells are controlled by using the operational amplifier and a replica cell to have a wide delay range. As a result, the working range can be set wide, jitters may be reduced and the chip size may also be reduced.

18 Claims, 5 Drawing Sheets

DELAY CIRCUIT OF CLOCK SYNCHRONIZATION DEVICE USING DELAY CELLS HAVING WIDE DELAY RANGE

BACKGROUND OF INVENTION

1. Technical Field

A delay circuit for a clock synchronization device and, more particularly, a delay circuit for a clock synchronization device is disclosed having a positive feedback MOS cross-coupled delay cells and an operational amplifier and replica cell for controlling the delay cells.

2. Description of the Related Art

A general clock synchronization device such as a Delay Locked Loop (DLL) or a Phase Locked Loop (PLL) uses a Variable Delay Line (VDL) or a Voltage Controlled Oscillator (VCO). The VDL or VCO is constituted by a plurality of delay cells. The delay range of each delay cell is an important factor for determining the operation range of the clock synchronization device such as DLL or PLL.

There are generally a digital mode and an analog mode as operation modes for controlling the delay cells.

According to the digital mode, a desired delay time can be obtained by adjusting the number of the delay cells each having a fixed delay time. The precision in the digital mode is determined according to the fixed delay time of the delay cell. Accordingly this mode is unsuitable for a high-speed semiconductor memory device, which requires a high degree of precision. Also, since the operation range is proportional to the number of the delay cells, the delay cells are required in a large number to widen the operation range, thereby increasing the chip size. Moreover, the operation range is narrow and a jitter is large because the fixed delay time varies sensitive to the variation in Process, Voltage and Temperature (PVT).

Meanwhile, the analog mode sets a desired delay time through adjustment of an external control voltage because each delay cell thereof has a delay time variable to the control voltage. According to this mode, the chip size can be reduced since high precision is ensured and a wide working range can be obtained from a small sized delay cell.

FIG. 1 is a circuit diagram illustrating a detailed circuit of a conventional analog delay circuit.

The analog delay circuit includes an operational amplifier 1 for outputting a control voltage VBN by making the use of a reference voltage VREF. A delay unit 2 constituted by a plurality of delay cells DELCn is provided for delaying input signals VIN and /VIN for a predetermined delay time and then outputting signals VOUT and /VOUT by making the use of a control voltages VBN and VBP. A replica bias unit 3 having a constitution equivalent to that of the delay cells DELCn is included for outputting the output voltage VREP.

The operational amplifier 1 sets the level of the control voltage VBN according to a voltage difference between an output voltage VREP of the replica bias unit 3, and the reference voltage VREF. Therefore, the operational amplifier 1 outputs the control voltage VBN, which is adjusted to be equivalent to a difference between the output voltage VREP of the replica bias unit 3 and the reference voltage VREF.

The delay cell DELC1 of the delay unit 2 includes a variable current source 4 having a current value adjusted according to the control voltage VBN, an input block 5 for receiving input voltages VIN and /VIN, and a variable resistor block 6 having a resistance value adjusted according to the control voltage VBP.

In this case, the variable current source 4 is an NMOS transistor NM0 having a gate connected to the control voltage VBN and a source connected to a ground voltage VSS.

The input block 5 is constituted by NMOS transistors NM1 and NM2 having their gates connected to input voltages VIN and /VIN, respectively. The NMOS transistors NM1 and NM2 have a common source connected to a drain of the NMOS transistor NM0.

The variable resistor block 6 is constituted by PMOS transistors PM1 and PM2 having their gates connected to the control voltage VBP. The PMOS transistors PM1 and PM2 have a common source connected to the supply voltage VDD. Here, the PMOS transistors PM1 and PM2 have their drains respectively connected to the drains of the NMOS transistors NM1 and NM2.

The common drain of the NMOS transistor NM1 forming the input block 5 and the PMOS transistor PM1 forming the variable resistor block 6 and the common drain of the NMOS transistor NM2 forming the input block 5 and the PMOS transistor PM2 forming the variable resistor block 6 represent output terminals for respectively outputting signals VOUT and /VOUT.

In this case, the output signals VOUT and /VOUT of the (n−1)th delay cell DELC(n−1) are respectively applied to the input signals VIN and /VIN of the nth delay cell DELCn in the delay unit 2. In this manner, the output signals VOUT and /VOUT of the nth delay cell DELCn are respectively inputted to the input signals VIN and /VIN of the (n+1)th delay cell DELC(n+1).

The replica bias unit 3 comprises a variable current source 7 having a current value adjusted according to the control voltage VBN, an input block 8 connected to the supply voltage VDD and the reference voltage VREF, and a variable resistor block 9 having a resistance value adjusted according to the control voltage VBP. In this case, all components of the replica bias unit 3 have the features equivalent to those of the delay cell DELC1. Therefore, if the control voltage VBN is outputted to set the level of the output voltage VREP of the replica bias unit 3 to that of the reference voltage VREF, the levels of the output signals VOUT and /VOUT of all of the delay cells DELC1 are set to that of the reference voltage VREF. In this case, the reference voltage VBP is produced from a charge pump or a digital/analog converter DAC.

In the delay circuit of the clock synchronization device of the prior art as described above, the PMOS transistors PM1 and PM2 of the variable resistor block 6 as load transistors are required to operate in the linear range, so that the phase resolution of the delay circuit has the linear features. As a result, since the control voltage VBP has a narrow range the wording range becomes narrow.

SUMMARY OF DISCLOSURE

A delay circuit for a clock synchronization device is disclosed that has a plurality of delay cells each having a wide working range, thereby reducing the number of the delay cells and minimizing a phenomenon of jitter.

A delay circuit for a clock synchronization device is disclosed having a plurality of unit delay cells connected in series. Each of the unit delay cells comprise a variable current source having a current value adjusted according to a current control voltage; a variable resistance unit having a resistance value adjusted according to a resistance control voltage, wherein the variable resistance unit includes a cross-coupled adjustment device and outputs output signals through output terminals to a next unit delay cell; and an input device connected between the output terminals and the variable current source and configured to receive output signals from a previous unit delay cell.

Further disclosed is a delay circuit for a clock synchronization device comprising an operational amplifier configured to set a level of a current control voltage according to a voltage difference between a regulation voltage and a reference voltage. Also included is a delay unit that includes a plurality of unit delay cells connected in series, each of the unit delay cells having a delay time that is set according to a resistance control voltage and the current control voltage. A replica bias unit is included and configured to output the regulation voltage according to the resistance control voltage and the current control voltage. Each of the plurality of unit delay cells further includes a first variable current source having a first current value adjusted according to the current control voltage; a first variable resistance unit having a first resistance value adjusted according to the resistance control voltage, wherein the first variable resistance unit includes a first cross-coupled adjustment device and outputs output signals through output terminals to a next unit delay cell; and a first input device connected between the output terminals and the first variable current source and configured to receive output signals of a previous unit delay cell.

DESCRIPTION OF THE PREFERRED EMBODIMENTS

Figure 1:
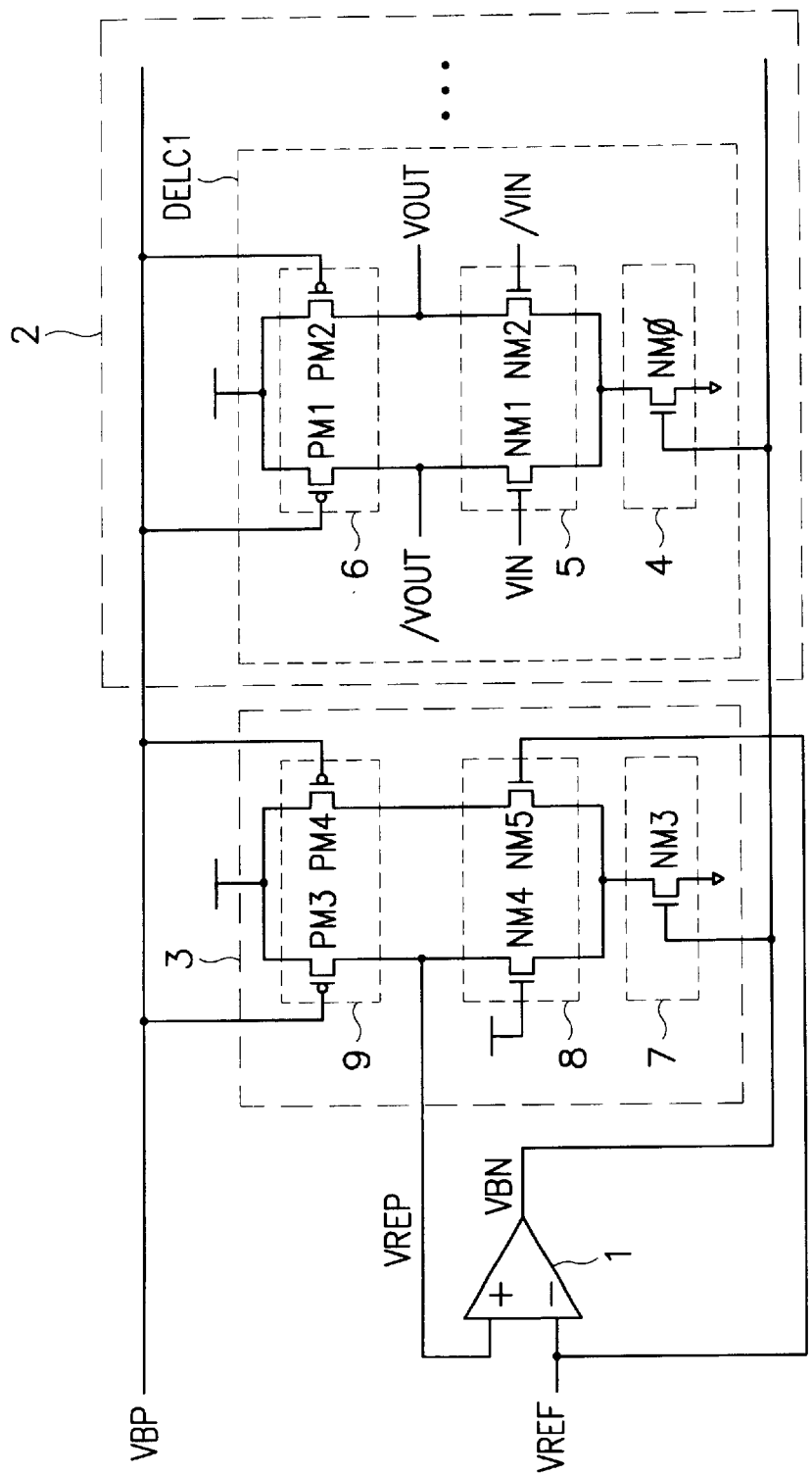
FIG. 1 is a circuit diagram showing a delay circuit of a clock synchronization device of the prior art.
Figure 2:
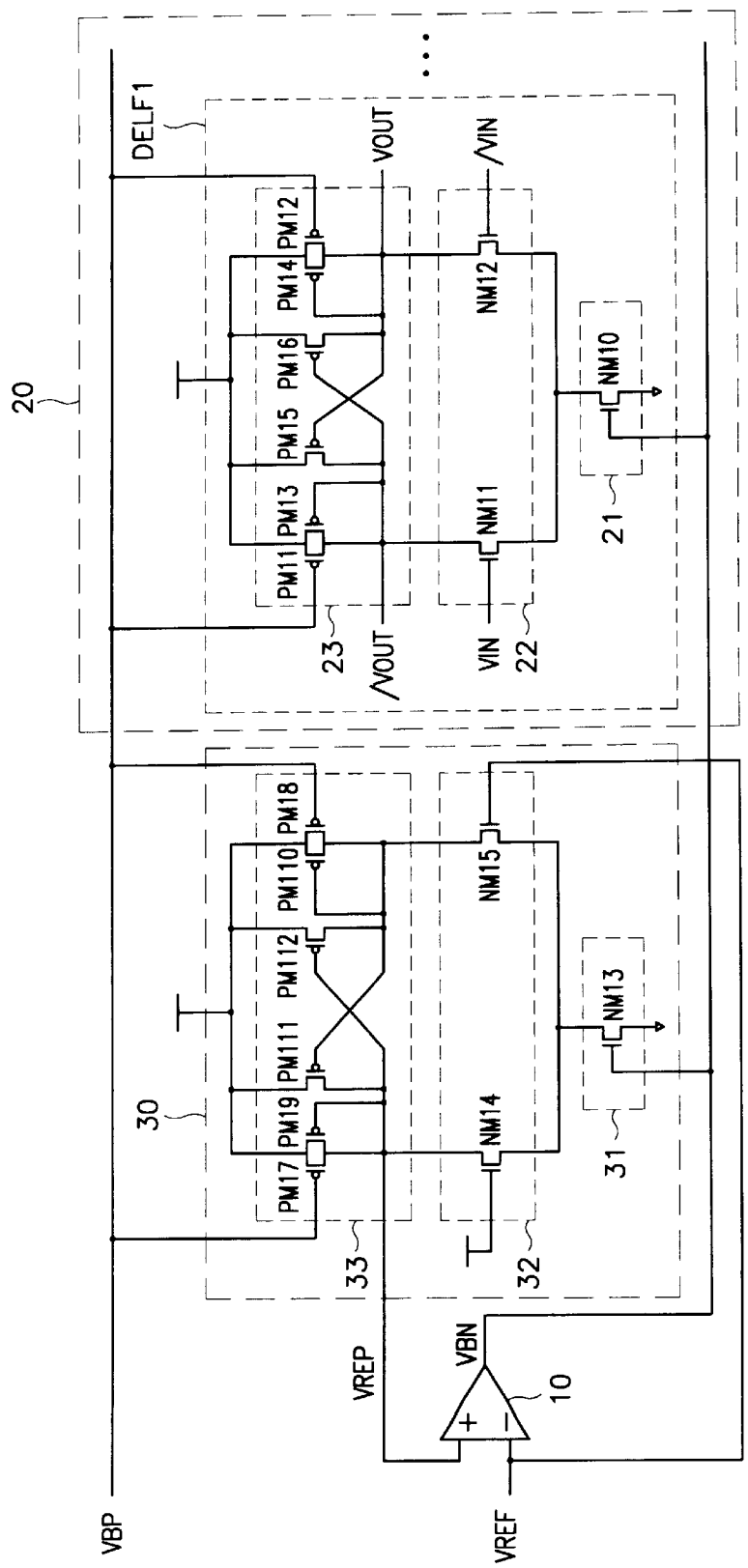
FIG. 2 is a circuit diagram showing a delay circuit of a clock synchronization device according to an embodiment of the present disclosure.

FIG. 2 is a block diagram showing a delay circuit of a clock synchronization device. As shown, the delay circuit of the clock synchronization device comprises an operational amplifier 10 for outputting the control voltage VBN by making use of a reference voltage VREF. A delay unit 20 composed of a plurality of delay cells DELF1-DELFn for delaying input signals VIN and /VIN and then outputting the output signals VOUT and /VOUT by making the use of the control voltages VBP and VBN. Finally, a replica bias unit 30 is included and comprised of components equivalent to those of the delay cells DELF1, for outputting an adjustment voltage VREP by which the delay cell DELF1 of the delay unit 20 is controlled to output the output voltages VOUT and /VOUT at a predetermined level.

In this case, the operational amplifier 10 sets the level of the control voltage VBN according to a voltage difference between the output voltage VREP of the replica bias unit 30 and the reference voltage VREF. That is, the operational amplifier 10 outputs the control voltage VBN, thereby setting the level of the output voltage VREP and the reference voltage VREF to be equivalent.

The delay cell DELF1 of the delay unit 20 comprise a variable current source 21, an input block 22 connected to the input voltages VIN and /VIN, and a variable resistor block 23 having a resistance value adjusted according to the control voltage VBP.

The variable current source 21 is comprised of an NMOS transistor NM10 having a gate connected to the control voltage VBN and a source connected to a supply voltage VDD.

The input block 22 is comprised of NMOS transistors NM11 and NM12 connected to the input signals VIN and /VIN, respectively. Here, the NMOS transistors NM11 and NM12 have commonly connected sources that are connected to a drain of the NMOS transistor NM10.

The variable resistor block 23 is comprised of PMOS transistors PM11 and PM12 having their gates connected to the control voltage VBP and commonly connected sources that are connected to the supply voltage VDD. PMOS transistors PM13 and PM14 are respectively connected in parallel to the PMOS transistors PM11 and PM12 and have their gates respectively connected to the output terminals VOUT and /VOUT. PMOS transistors PM15 and PM16 are cross-coupled to the output terminals VOUT and /VOUT. In this case, the commonly connected drains of PMOS transistor PM11 and NMOS transistor NM11 and the commonly connected drains of PMOS transistor PM12 and NMOS transistor NM12 are formed at the output terminals VOUT and /VOUT, respectively.

The output signals VOUT and /VOUT of (n−1)th delay cell DELF(n−1) are respectively applied to the input signals VIN and /VIN of the nth delay cell DELFn in the delay unit 20 comprising a plurality of delay cells DELF1-DELFn. In this way, the output signals VOUT and /VOUT of the nth delay cells DELFn are respectively inputted to the input signals VIN and /VIN of the (n+1)th delay cell DELF(n+1).

In the present device of FIG. 2, the control voltage VBP may be produced from a charge pump or a digital/analog converter DAC.

The PMOS transistors PM11, PM13, PM12 and PM14 are operated in a variable resistance with a resistance value that is determined according to the control voltage VBP.

Each of the cross-coupled PMOS transistors PM15 and PM16 comprises a positive feedback path about each of the output terminals VOUT and /VOUT.

In this case, the delay cells DELF1 have a delay time TD, which can be obtained according to Equation 1:

$$TD \frac{load\ swing}{source} \quad (1)$$

where $C_{load}$ represents a capacitance between the differential output terminals VOUT and /VOUT, $V_{swing}$ represents a width of swing of the output voltages VOUT and /VOUT, and $I_{source}$ represents a current produced by the variable current source 21.

In this case, if $C_{load}$ and $V_{swing}$ are constant, the delay time TD is inversely proportional to $I_{source}$. For example, when the input voltage VIN in a low level is initially applied, the NMOS transistor NM11 of the input block 22 is turned off and the NMOS transistor NM12 is turned on. As a result, the output voltage VOUT has a low level. When the input voltage VIN transits from a low level to a high level, the NMOS transistor NM11 of the input block 22 is turned on from a turned off state and the NMOS transistor NM12 is turned off from a turned on state. As a result, the current flowing through the NMOS transistor NM11 increases and the current flowing through the NMOS transistor NM12 decreases.

At this time, the voltage of the inverse output terminal /VOUT transits from a high level to a low level so that the currents flowing through the PMOS transistors PM11, PM13 and PM15 decrease.

Figure 3:
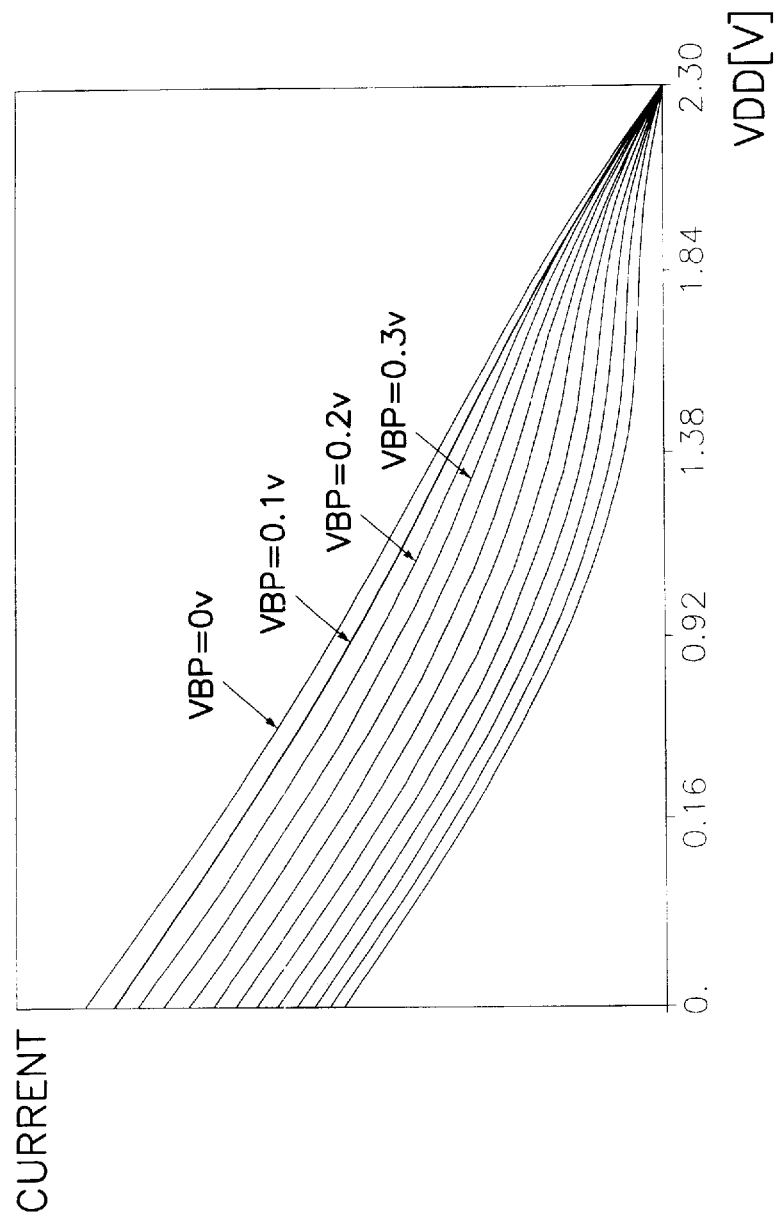
FIG. 3 is a graph illustrating current-voltage features of a variable resistor unit according to a control voltage VBP in the circuit diagram shown in FIG. 2.

When the control voltage VBP has a sufficient level for turning on the PMOS transistors PM11 and PM12, as illustrated in FIG. 3, a current $I_{PMOS}$ flowing through the PMOS transistors PM11, PM13, PM12 and PM14 linearly decreases as the supply voltage VDD increases. In this case, a common node level is formed in the middle of a voltage swing width VPP about the output voltages VOUT and /VOUT.

Meanwhile, when the control voltage VBP does not have a sufficient level for turning on the PMOS transistors PM11 and PM12 of the variable resistor bock 23 (i.e., a voltage level slightly larger than the threshold voltage of the PMOS transistors), the PMOS transistors PM11 and PM12 operate in a substantially saturated region. As a result, as shown in FIG. 3, the current $I_{PMOS}$ flowing through PM11, PM13, PM12 and PM14 of the variable resistor block 23 linearly decreases due to the increase of the supply voltage VDD. Linearity increases by being linearly decreased by the PMOS transistors PM15 and PM16 which are cross-coupled to the output terminals VOUT and /VOUT. Therefore, the common node level can be formed in the middle of the voltage swing width VPP about the output voltages VOUT and /VOUT.

The replica bias unit 30 comprises a variable current source 31 comprised of an NMOS transistor NM13 having a current value adjusted according to the control voltage VBN. An input block 32 is included that is comprised of NMOS transistors NM14 and NM15 respectively connected to the supply voltage VDD and the reference voltage VREF. A variable resistor block 33 is included and comprised of PMOS transistors PM17, PM19, PM112 and PM110, cross-coupled PMOS transistors PM111 and PM112 and having a resistance value adjusted according to the control voltage VBP.

In this case, the reference voltage VREF sets swing widths $V_{swing}$ of the output voltages VOUT and /VOUT.

The operational amplifier 10 outputs the control voltage VBN for adjusting the output voltage VREP of replica bias unit 30 equivalent to the reference voltage VREF due to DC gain features. Here, the reference voltage VREF is constant regardless of the frequency of input clock signals so that the swing widths $V_{swing}$ of the output voltages VOUT and /VOUT of the delay cell DELF1 are always constant regardless of the frequency.

Figure 4:
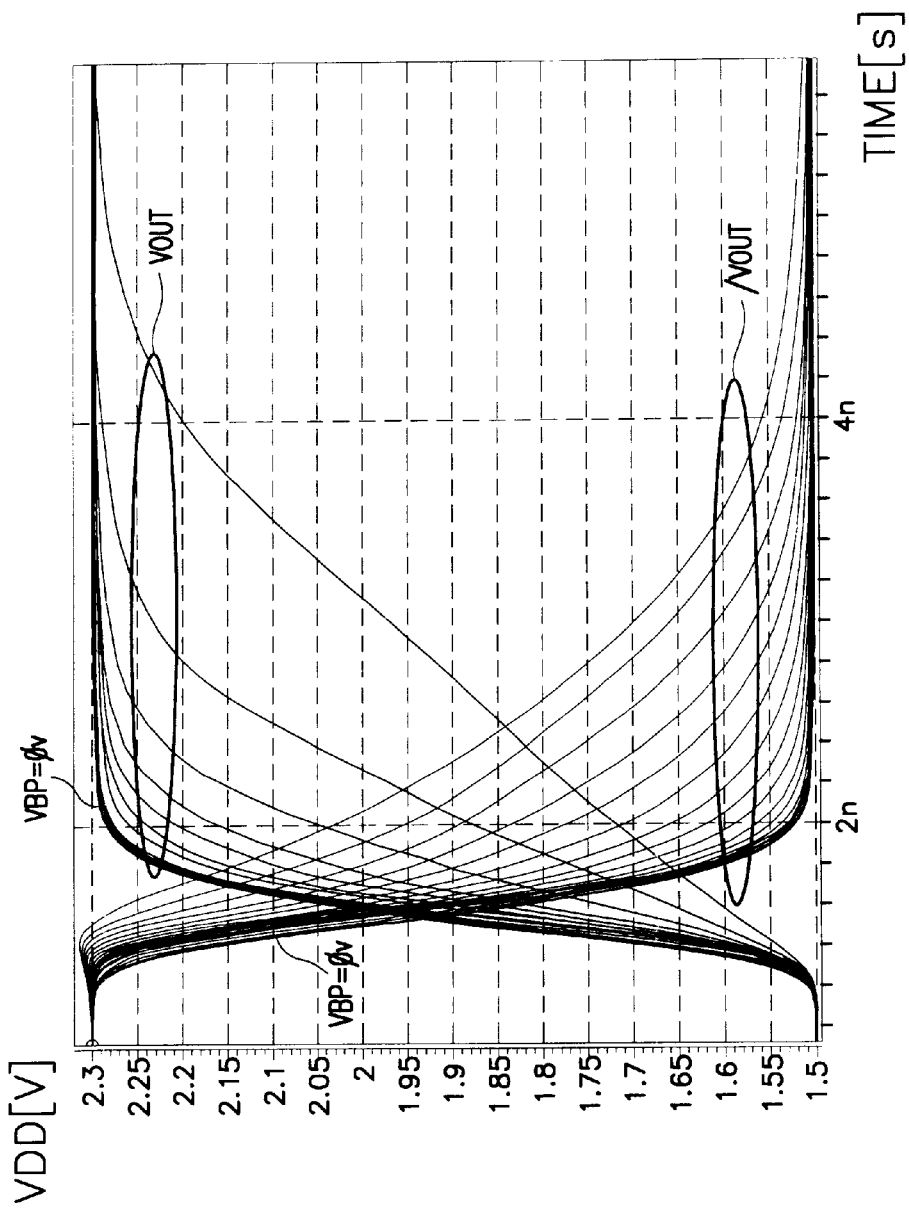
FIG. 4 is a graph illustrating operation simulations according to the circuit diagram shown in FIG. 2.

Therefore, FIG. 4 shows simulation results of the difference between the delay times of the delay cell DELF1 according to the control voltage VBP. In this case, the input signal VIN, which transits from the low level to the high level, will be described as an example.

As shown in FIG. 4, if the control voltage VBP is "0V", the output signal VOUT transits from the high level to the low level substantially without delay as the input signal VIN transits from the low level to the high level.

As the control voltage VBP increases, the time point where the output signal VOUT transits is delayed proportional to the time point where the input signal VIN transits from the low level to the high level.

Such a delay circuit of the presently disclosed clock synchronization device, as shown in FIG. 2, adopts a mode for adjusting the delay time of the delay cell DELF1 through adjustment of the resistance value of the variable resistor block 23 according to the control voltage VBP while constantly maintaining the current value of the variable current source 21 by the control voltage VBN, which is adjusted for constantly maintaining the level of the output signal VOUT by the operation amplifier 10.

Figure 5:
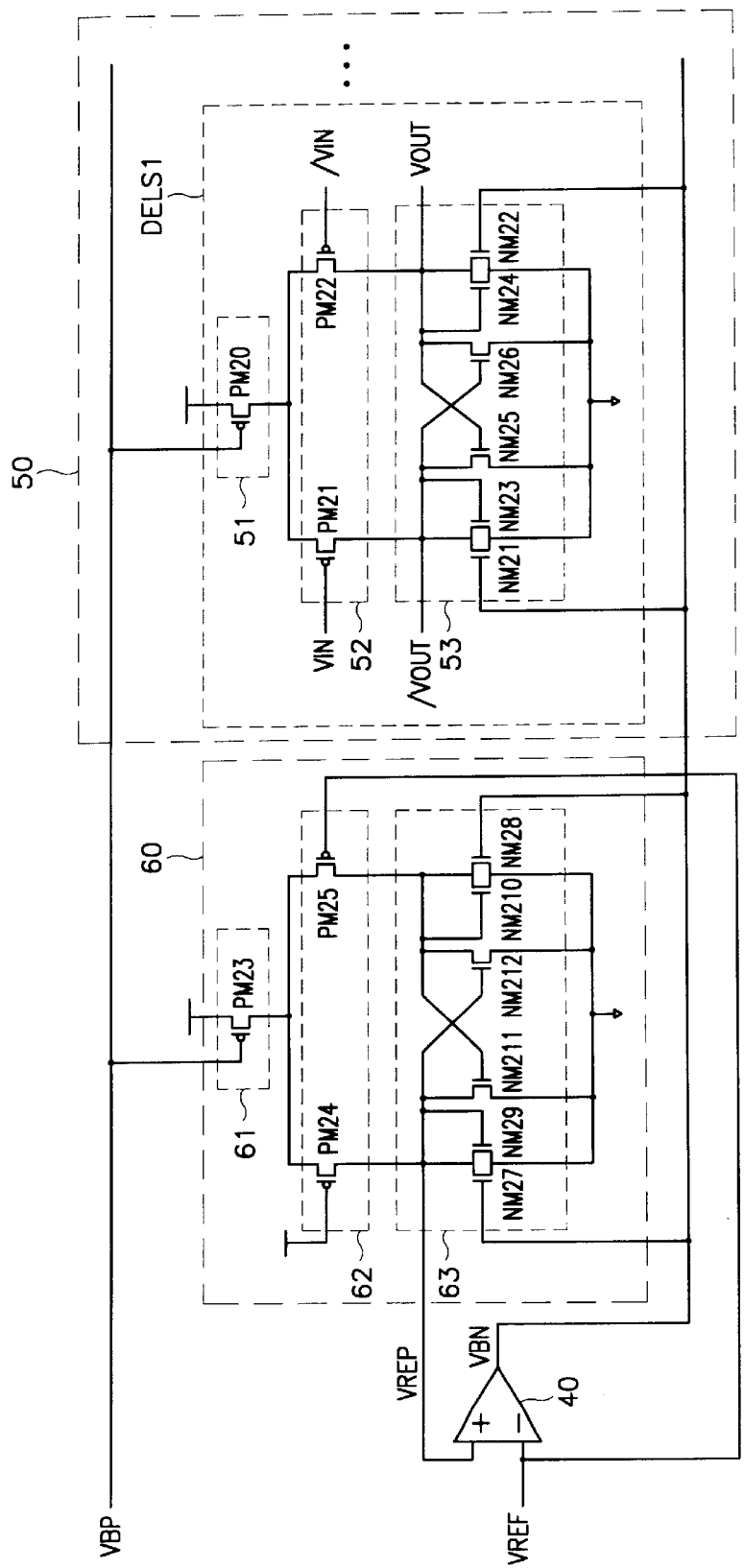
FIG. 5 is a circuit diagram showing a delay circuit of a clock synchronization device according to another embodiment of the present disclosure.

FIG. 5 is a circuit diagram of a delay circuit of a clock synchronization device according to another embodiment. Here, the delay circuit of the clock synchronization device comprises an operational amplifier 40 for outputting a control voltage VBN for outputting an adjustment voltage VREP equivalent to the level of a reference voltage VREF; a delay unit 50 comprised of a plurality of delay cells DELS1-DELSn for delaying input signals VIN and /VIN for a certain time period by using the control voltage VBN and VBP to output signals VOUT and /VOUT; and a replica bias unit 60 comprised of components equivalent to the delay cells DELS1 for outputting the output voltage VREP according to the control voltage VBN.

In this case, the operational amplifier 40 sets the level of the control voltage VBN according to the output voltage VREP of the replica bias unit 60 based upon the reference voltage VREF. Therefore, the operational amplifier 40 outputs the control voltage VBN for adjusting the output voltage VREP of the replica bias unit 60 equivalent to the reference voltage VREF.

The delay cells DELS1 of the delay unit 50 comprise a variable current source 51 having a current value adjusted according to the control voltage VBP, an input block 52 connected to the input voltages VIN and /VIN, and a variable resistor block 53 having a resistance value adjusted according to the control voltage VBN.

In this case, the variable current source 51 is comprised of a PMOS transistor PM20 having a control terminal connected to the control voltage VBP and a source connected to a supply voltage VDD.

The input block 52 is comprised of PMOS transistors PM21 and PM22 having control terminals respectively connected to the input voltages VIN and /VIN. In this case, the PMOS transistors PM21 and PM22 have sources connected in common and connected to a drain of a PMOS transistor PM50, which defines the variable current source 51.

The variable resistor block 53 is comprised of NMOS transistors NM21 and NM22 having their gates connected to the control voltage VBN and commonly connected sources connected to the supply voltage VDD, NMOS transistors NM23 and NM24 respectively connected in parallel with the NMOS transistors NM21 and NM22 and having their gates respectively connected to output terminals VOUT and /VOUT and NMOS transistors NM25 and NM26 cross-coupled to the output terminals VOUT and /VOUT. In this case, the common drain of NMOS transistor NM21 and the PMOS transistor PM21 and the common drain of NMOS transistor NM22 and the PMOS transistor PM22 are formed at the output terminals VOUT and VOUT, respectively.

In this case, the input signals VIN and /VIN of the nth delay cell DELSn are respectively connected to the output signals VOUT and /VOUT of the (n−1)th delay cell DELS(n−1) in the delay unit 50 comprised of the plurality of delay cells DELS1-DELSn. In the same manner, the output signals VOUT and /VOUT of the nth delay cell DELSn are inputted to the input signals VIN and /VIN of the (n+1)th delay cell DELS(n+1).

A delay circuit of the clock synchronization device, such as that shown in FIG. 5, adopts a mode for adjusting the delay time of the delay cell DELS1 through adjustment of the resistance value of the variable resistor block 53 according to the control voltage VBP while constantly maintaining the current value of the variable current source 51 by the control voltage VBN, which is adjusted to constantly maintain the level of the output signal VOUT by the operation amplifier 40.

The replica bias unit 60 comprises a variable current source 61 comprised of an NMOS transistor NM23 having a current value adjusted according to the control voltage VBP, an input block 62 comprised of PMOS transistors PM24 and PM25 respectively connected to the supply voltage VDD and the reference voltage VREF, and a variable resistor block 63 comprised of NMOS transistors NM27, NM29, NM212 and NM210 having a resistance value adjusted according to the control voltage VBP and cross-coupled NMOS transistors NM211 and NM212.

Here, the reference voltage sets swing widths $V_{swing}$ of the output voltages VOUT and /VOUT of the delay cell DELS1.

While the operational amplifiers 10 or 40 and the replica bias units 30 or 60 are adopted to constantly maintain the level of the output voltage VOUT in the delay cell of the clock synchronization device according to the presently disclosed embodiments, only the delay units 20 or 50 can be used to define the delay circuit of the clock synchronization device.

As described in the foregoing disclosure, the delay circuit of the clock synchronization device according to the present disclosure has a wide delay range using the positive feedback cross-coupled MOS so that a wide working range can be ensured even if the delay cells are used in a small number while the number of the jitters can be reduced.

While the teachings of the invention have been explained with respect to particular examples, it will be apparent to those of ordinary skill in the art that the scope of this patent is not limited to those examples. On the contrary, this patent covers all apparatuses and methods falling within the spirit and scope of the appended claims, either literally or under the doctrine of equivalents.

What is claimed is:

1. A delay circuit for a clock synchronization device having a plurality of unit delay cells connected in series, wherein each unit delay cell comprises:
    a variable current source having a current value adjusted according to a current control voltage;
    a variable resistance unit having a resistance value adjusted according to a resistance control voltage, wherein the variable resistance unit includes a cross-coupled adjustment device and outputs output signals through output terminals to a next unit delay cell;
    an input device connected between the output terminals and the variable current source and configured to receive output signals from a previous unit delay cell; and
    wherein the variable resistance unit further comprises:
        a plurality of first PMOS transistors having gates connected to the resistance control voltage and commonly connected sources that are connected to a supply voltage;
        a plurality of second PMOS transistors having gates respectively connected to the output terminals and commonly connected sources that are connected to the supply voltage; and
        third and fourth PMOS transistors having commonly connected sources that are connected to the supply voltage and having gates that are respectively cross-coupled to the output terminals.

2. The delay circuit according to claim 1, Wherein the variable current source further comprises:
    an NMOS transistor having a gate connected to the current control voltage, a drain connected to the input device and a source connected to a ground voltage.

3. A delay circuit for a clock synchronization device having a plurality of unit delay cells connected in series, wherein each unit delay cell comprises:
    a variable current source having a current value adjusted according to a current control voltage;
    a variable resistance unit having a resistance value adjusted according to a resistance control voltage, wherein the variable resistance unit includes a cross-coupled adjustment device and outputs output signals through output terminals to a next unit delay cell; and
    an input device connected between the output terminals and the variable current source and configured to receive output signals from a previous unit delay cell wherein the variable resistance unit further comprises:
        a plurality of first NMOS transistors having gates connected to the resistance control voltage and commonly connected sources that are connected to a ground voltage;
        a plurality of second NMOS transistors having gates respectively connected to the output terminals and commonly connected sources that are connected to the ground voltage; and
        third and fourth NMOS transistors having common source connected to the ground voltage and gates respectively cross-coupled to said output terminals.

4. The delay circuit according to claim 3, wherein the variable current source further comprises:
    a PMOS transistor having a gate connected to the current control voltage, a drain connected to the input device and a source connected to the supply voltage.

5. A delay circuit for a clock synchronization device comprising:
    an operational amplifier configured to set a level of a current control voltage according to a voltage difference between a regulation voltage and a reference voltage;
    a delay unit that includes a plurality of unit delay cells connected in series, each of the plurality of unit delay cells having a delay time that is set according to a resistance control voltage and the current control voltage; and
    a replica bias unit configured to output the regulation voltage according to the resistance control voltage and the current control voltage;
    wherein each of the plurality of unit delay cells further includes:
        a first variable current source having a first current value adjusted according to the current control voltage;
        a first variable resistance unit having a first resistance value adjusted according to the resistance control voltage, wherein the first variable resistance unit includes a first cross-coupled adjustment device and outputs output signals through output terminals to a next unit delay cell; and
        a first input device connected between the output terminals and the first variable current source and configured to receive output signals of a previous unit delay cell; and
    wherein the replica bias unit further comprises:

a second variable current source having a second current value adjusted according to the current control voltage;

a second variable resistance unit that includes a second cross-coupled adjustment device and having a second resistance value adjusted according to the resistance control voltage; and a second input device connected between the second variable current source and the second variable resistance unit and further connected to a supply voltage and the reference voltage wherein the second variable resistance unit and the second input device have a common node configured to form output terminals.

6. The delay circuit according to claim 5, wherein the replica bias unit comprises components equivalent to the unit delay cells of the delay unit.

7. A delay circuit for a clock synchronization device comprising:

an operational amplifier configured to set a level of a current control voltage according to a voltage difference between a regulation voltage and reference voltage;

a delay unit that includes a plurality of unit delay cells connected in series, each of the plurality of unit delay cells having a delay time that is set according to a resistance control voltage and the current control voltage; and a replica bias unit configured to output the regulation voltage according to the resistance control voltage and the current control voltage;

wherein each of the plurality of unit delay cells further includes:

first variable current source having a first current value adjusted according to the current control voltage;

a first variable resistance unit having a first resistance value adjusted according to the resistance control voltage, wherein the first variable resistance unit includes a first cross-coupled adjustment device and outputs output signals through output terminals to a next unit delay cell; and a first input device connected between the output terminals and the first variable current source and configured to receive output signals of a previous unit delay cell wherein the first variable resistance unit further comprise:

a plurality of first PMOS transistors having gates connected to the resistance control voltage and commonly connected sources that are connected to a supply voltage;

a plurality of second PMOS transistors having gates respectively connected to the output terminals and commonly connected sources that are connected to the supply voltage; and third and fourth PMOS transistors having commonly connected sources that are connected to the supply voltage and having gates that are respectively cross-coupled to the output terminals.

8. The delay circuit according to claim 7, wherein the first variable current further comprises:

an NMOS transistor having a gate connected to the current control voltage, a drain connected to the first input device and a source connected to a ground voltage.

9. A delay circuit for a clock synchronization device comprising:

an operational amplifier configured to set a level of a current control voltage according to a voltage difference between a regulation voltage and reference voltage;

a delay unit that includes a plurality of unit delay cells connected in series, each of the plurality of unit delay cells having a delay time that is set according to a resistance control voltage and the current control voltage; and a replica bias unit configured to output the regulation voltage according to the resistance control voltage and the current control voltage;

wherein each of the plurality of unit delay cells further includes:

a first variable current source having a first current value adjusted according to the current control voltage:

a first variable resistance unit having a first resistance value adjusted according to the resistance control voltage, wherein the first variable resistance unit includes a first cross-coupled adjustment device and outputs output signals through output terminals to a next unit delay cell; and a first input device connected between the output terminals and the first variable current source and configured to receive output signals of a previous unit delay cell wherein the first variable resistance unit further comprises:

a plurality of first NMOS transistors having gates connected to the resistance control voltage and commonly sources that are connected to a ground voltage;

a plurality of second NMOS transistors having gates respectively connected to the output terminals and commonly connected sources that are connected to the ground voltage; and third and fourth NMOS transistors having common source connected to the ground voltage and gates respectively cross-coupled to said output terminals.

10. The delay circuit according to claim 9, wherein the first variable current source further comprises:

a PMOS transistor having a gate connected to the current control voltage, a drain connected to the first input device and a source connected to the supply voltage.

11. A delay circuit for a clock synchronization device having a plurality of unit delay cells connected in series, wherein each unit delay cell comprises:

a variable current source having a current value adjusted according to a current control voltage;

a variable resistance unit having a resistance value adjusted according to a resistance control voltage, wherein the variable resistance unit includes a cross-coupled adjustment device and outputs output signals through output terminals to a next unit delay cell;

an input device connected between the output terminals and the variable current source and configured to receive output signals from a previous unit delay cell; and wherein the variable resistance unit further comprises a plurality of first PMOS transistors having gates connected to the resistance control voltage and commonly connected sources that are connected to a supply voltage and a ground voltage;

a plurality of second PMOS transistors having gates respectively connected to the output terminals and commonly connected sources that are connected to the supply voltage and the ground voltage; and third and fourth PMOS transistors having commonly connected sources that are connected to the supply voltage and the ground voltage and having gates that are respectively cross-coupled to the output terminals.

12. The delay circuit according to claim 11, wherein the variable current source further comprises:

an NMOS transistor having a gate connected to the current control voltage, a drain connected to the input device and a source connected to the ground voltage.

13. The delay circuit according to claim 12, wherein the variable current source further comprises:

a PMOS transistor having a gate connected to the current control voltage, a drain connected to the input device and a source connected to the supply voltage.

14. A delay circuit for a clock synchronization device comprising:

an operational amplifier configured to set a level of a current control voltage according to a voltage difference between a regulation voltage and reference voltage;

a delay unit that includes a plurality of unit delay cells connected in series, each of the plurality of unit delay cells having a delay time that is set according to a resistance control voltage and the current control voltage; and a replica bias unit configured to output the regulation voltage according to the resistance control voltage and the current control voltage;

wherein each of the plurality of unit delay cells further includes:
 a first variable current source having a first current value adjusted according to the current control voltage;
 a first variable resistance unit having a first resistance value adjusted according to the resistance control voltage, wherein the first variable resistance unit includes a first cross-coupled adjustment device and outputs output signals through output terminals to a next unit delay cell;
 a first input device connected between the output terminals and the first variable current source and configured to receive output signals of a previous unit delay cell; and wherein the replica bias unit further comprises
 a second variable current source having a second current value adjusted according to the current control voltage;
 a second variable resistance unit that includes a second cross-coupled adjustment device and having a second resistance value adjusted according to the resistance control voltage; and
 a second input device connected between the second variable current source and the second variable resistance unit and further connected to a supply voltage and the reference voltage;

wherein the second variable resistance unit and the second input device have a common node configured to form output terminals;

wherein the first variable resistance unit further comprises a plurality of first PMOS transistors having gates connected to the resistance control voltage and commonly connected sources that are connected to a supply voltage;

a plurality of second PMOS transistors having gates respectively connected to the output terminals and commonly connected sources that are connected to the supply voltage; and third and fourth PMOS transistors having commonly connected sources that are connected to the supply voltage and having gates that are respectively cross-coupled to the output terminals.

15. The delay circuit according to claim 14, wherein the replica bias unit comprises components equivalent to the unit delay cells of the delay unit.

16. The delay circuit according to claim 14, wherein the first variable current further comprises:

an NMOS transistor having a gate connected to the current control voltage, a drain connected to the first input device and a source connected to a ground voltage.

17. The delay circuit according to claim 14, wherein the first variable resistance unit further comprises:

a plurality of first NMOS transistors having gates connected to the resistance control voltage and commonly sources that are connected to a ground voltage;

a plurality of second NMOS transistors having gates respectively connected to the output terminals and commonly connected sources that are connected to the ground voltage; and third and fourth NMOS transistors having common source connected to the ground voltage and gates respectively cross-coupled to said output terminals.

18. The delay circuit according to claim 17, wherein the first variable current source further comprises:

a PMOS transistor having a gate connected to the current control voltage, a drain connected to the first input device and a source connected to the supply voltage.

* * * * *

UNITED STATES PATENT AND TRADEMARK OFFICE
CERTIFICATE OF CORRECTION

PATENT NO.    : 6,686,788 B2
DATED         : February 3, 2004
INVENTOR(S)   : Kim et al.

It is certified that error appears in the above-identified patent and that said Letters Patent is hereby corrected as shown below:

Column 8,
Line 1, after "to claim 1," please delete "Wherein" and insert -- wherein -- in its place.
Line 62, after "next unit delay cell;" please delete "and"

Column 9,
Lines 22-23, after "a regulation voltage," please delete "and reference voltage;" and insert -- and a reference voltage; -- in its place.
Line 47, after "unit further;" please delete "comprise:" and insert -- comprises -- in its place.

Column 10,
Line 3, after "a regulation voltage," please delete "and reference" and insert -- and a reference -- in its place.

Column 11,
Line 20, after "a regulation voltage," please delete "and reference" and insert -- and a reference -- in its place.

Signed and Sealed this

Eleventh Day of May, 2004

JON W. DUDAS
*Acting Director of the United States Patent and Trademark Office*